(12) United States Patent
Najda

(10) Patent No.: US 7,251,407 B2
(45) Date of Patent: Jul. 31, 2007

(54) INTEGRATED ACTIVE PHOTONIC DEVICE AND PHOTODETECTOR

(75) Inventor: Stephen Najda, Glasgow (GB)

(73) Assignee: Intense Photonics Limted, High Blantyre, Glasgow ( * ) Notice: Subject to any disclaimer, the term of this patent is extended or adjusted under 35 U.S.C. 154(b) by 0 days.

(21) Appl. No.: 10/510,802

(22) PCT Filed: Apr. 3, 2003

(86) PCT No.: PCT/GB03/01461

§ 371 (c)(1),
(2), (4) Date: Jun. 17, 2005

(87) PCT Pub. No.: WO03/088367

PCT Pub. Date: Oct. 23, 2003

(65) Prior Publication Data
US 2005/0230722 A1    Oct. 20, 2005

(30) Foreign Application Priority Data
Apr. 10, 2002    (GB)    ................. 0208211.3

(51) Int. Cl.
G02B 6/12    (2006.01)
H01S 5/026    (2006.01)

(52) U.S. Cl. ............ 385/131; 385/14; 372/50.1; 372/50.21

(58) Field of Classification Search ............ 385/14, 385/147, 89; 257/293; 372/6, 43
See application file for complete search history.

(56) References Cited
U.S. PATENT DOCUMENTS

| 4,653,058 A | 3/1987 | Akiba et al. |
| 4,788,690 A | 11/1988 | Akiba et al. |
| 5,134,671 A | 7/1992 | Koren et al. |
| 5,252,513 A | 10/1993 | Thornton et al. |
| 5,287,376 A * | 2/1994 | Paoli .................. 372/50.122 |
| 5,838,708 A | 11/1998 | Lin et al. |

(Continued)

FOREIGN PATENT DOCUMENTS

EP    0405801    1/1991

(Continued)

OTHER PUBLICATIONS

Hofstetter, D. et al., "Monolithically Integrated DBR Laser, Detector, and Transparent Waveguide Fabricated in a Single Growth Step," *IEEE Photonics Technology Letters*, 7(9):1022-1024 (1995).

(Continued)

*Primary Examiner*—Rodney Bovernick
*Assistant Examiner*—Omar Rojas
(74) *Attorney, Agent, or Firm*—Fish & Richardson P.C.

(57) ABSTRACT

An active photonic device includes a semiconductor substrate, an optically active region formed on the semiconductor substrate, the optically active region including a first electrical contact for initiating emission of photons and/or modulation of photons within the optically active region, an optical confinement structure defining a principal optical path through the active photonic device and through the optically active region, and a photodetector structure formed on the semiconductor substrate. The photodetector includes a second electrical contact displaced from, and substantially electrically insulated from, the first electrical contact and overlying at least part of the principal optical path, the photodetector for receiving carriers generated by emitted photons.

20 Claims, 3 Drawing Sheets

U.S. PATENT DOCUMENTS

| | | | |
|---|---|---|---|
| 6,406,196 B1 * | 6/2002 | Uno et al. | 385/89 |
| 6,628,686 B1 * | 9/2003 | Sargent | 372/46.01 |
| 6,717,971 B2 * | 4/2004 | Marsh et al. | 372/50.1 |
| 6,888,864 B1 * | 5/2005 | Kawanishi et al. | 372/36 |

FOREIGN PATENT DOCUMENTS

| | | |
|---|---|---|
| GB | 2387481 A | 10/2003 |
| WO | WO01/88992 | 11/2001 |
| WO | WO01/88993 | 11/2001 |

OTHER PUBLICATIONS

Sasaki et al., Electronic Letters, 17(3):136-138 (1989).
Koren et al., IEEE Photonics Tech Letters, 8(3):364 (1996).
Search Report dated Jan. 7, 2003 in corresponding British application.
Response to Office Action in British Application No. 0208211.3.

* cited by examiner

INTEGRATED ACTIVE PHOTONIC DEVICE AND PHOTODETECTOR

TECHNICAL FIELD

The present invention relates to monolithic integration of photonic devices, such as semiconductor lasers and optical amplifiers, with photodetectors.

BACKGROUND

Photonic devices, such as semiconductor lasers, optical modulators and optical amplifiers are widely used in modem telecommunication systems. It is desirable to monitor the optical output of such photonic devices on chip. This is especially desirable when multiple devices are integrated onto one chip, and more than one optical device has to be monitored.

However, it is problematic to control or monitor the output of an optical device output because the gain of a laser or amplifier can be affected by a number of factors, including:

i) environmental effects, such as temperature, humidity, changes in wavelength and polarisation etc;
ii) device degradation, due to crystalline defects, deterioration of contacts, etc; and
iii) misalignment of optical coupling elements due to shock, strain, etc.

At present, bulk detectors and couplers are used to monitor and control a semiconductor laser or amplifier, but these prove to be expensive, lossy and impractical for large scale monolithic integration.

For a semiconductor laser, a photodetector can be positioned at the back facet of the laser. The facets of a semiconductor laser are typically coated with a highly reflective (HR) coating, having a reflection coefficient, R, of up to ~95% on the back facet and an anti-reflection (AR) coating with R~5% on the front facet. The photodetector can measure the light escaping from the back facet (R~95%) and hence monitor the device.

For a semiconductor optical amplifier, no facet is available for monitoring by a photodetector, since both the front and back facets are employed for ingress and egress of optical radiation. Therefore, one solution, as taught in U.S. Pat. No. 5,134,671, is to employ an integrated branching waveguide, such as a Y-junction waveguide, to tap off a fraction of the output power to feed to a photodetector, to monitor the amplifier.

U.S. Pat. No. 5,134,671 describes a monolithic integrated optical amplifier and photodetector. The optical amplifier and photodetector are integrated on the same substrate, the photodetector being optically coupled to the optical amplifier via a branching waveguide having low radiative loss and low back reflectivity. This is achieved with a difficult manufacturing process to form the Y-shaped waveguide with a branch of the waveguide having a gradual decrease in the effective refractive index such as to decrease the difference between the refractive indices at the optical interface of the truncated wedge tip to avoid optical coupling of the amplifier.

Due to fabrication/device limitations, practical Y-junction waveguides have truncated wedge tips. See, for example, Sasaki et. al. Electronic Letters, Vol. 17, No. 3, pp 136-8 (1989). However, a blunted Y-junction tip, which inhibits a substantial amount of optical back-reflection to the optical amplifier, restricts the monolithic integration of a coupled optical amplifier and monitoring photodetector.

A 1.3 μm laser with an integrated power monitor using a directional coupling optical power tap is described in U. Koren et al, IEEE Photonics Tech. Letters, Vol. 8, No. 3, p364 (1996). This work describes a Y-junction optical tap using a passive dual waveguide directional coupler next to the back HR facet of the cavity.

The disadvantage with the process described is that four growth steps are required to construct the device, including an overgrowth to deposit the passive waveguide region. The different growth steps considerably increase the device fabrication difficulty, hence reduce yields and increase costs.

SUMMARY

It is an object of the present invention to provide a photonic device such as a semiconductor laser or amplifier with an integrated photo detection device that is easy to manufacture. It is a further object of the present invention to provide such a device in which the interference with the optically active lasing or amplifying device by the photo-detection device is reduced over prior art systems.

It is a further object of the present invention to provide a photodetection device integrated onto the same substrate as a photonic device and positioned in relation to a bandgap shifted portion of the de ice, that can be used to test the bandgap shift.

According to one aspect, the present invention provides an active photonic device and photodetector integrated on a single substrate, the photodetector adapted for monitoring an output of the active device, comprising:

a semiconductor substrate;
an optically active region formed on the substrate including a first electrical contact thereon for initiating emission of photons and/or modulation of photons within the optically active region;
an optical confinement structure generally defining a principal optical path through the device and through said optically active region;
a photodetector structure formed on the substrate including a second electrical contact displaced from and substantially electrically insulated from the first contact, overlying a part of the principal optical path, for receiving carriers generated by said emitted photons.

According to another aspect, the present invention provides an active photonic device and photodetector integrated on a single substrate, the photodetector adapted for monitoring an output of the active device, comprising:

a semiconductor substrate;
an optically active region formed on the substrate including a first electrical contact thereon;
a non-branching optical confinement structure generally defining an optical path through the device and through said optically active region;
a photodetector structure formed on the substrate including a second electrical contact displaced from and electrically insulated from the first contact for receiving carriers generated by photons in the optically active region.

According to a further aspect the present invention provides an active photonic device and characterisation contact integrated on a single substrate, the characterisation contact for enabling detection of a degree of bandgap shift in the device, comprising:

a semiconductor substrate;
an optically active region formed on the substrate and comprising a semiconductor medium having a first bandgap, and including a first electrical contact thereon for initiating emission of photons and/or modulation of photons within the optically active region;

a bandgap shifted region formed on the substrate and comprising a semiconductor medium having a second bandgap shifted from said first bandgap;

a characterisation contact formed on the substrate, displaced from and substantially electrically insulated from the first electrical contact, at least a part of the characterisation contact overlaying the bandgap shifted region.

According to another aspect, the present invention provides a method of determining a degree of bandgap shift introduced between a first region of semiconductor medium and a second region of semiconductor medium, comprising the steps of:

forming a photonic device on a substrate, including a first region in which the semiconductor medium has a first bandgap, and a second region in which the semiconductor medium has a second bandgap shifted from said first bandgap;

depositing a first contact in said first region for operating said photonic device;

depositing a second contact at least partially overlying said second region; and electrically biassing said second contact to generate an electroluminescence signal in the semiconductor medium indicative of the magnitude of at least said second bandgap.

According to another aspect, the present invention provides a method of determining a degree of bandgap shift introduced between a first region of semiconductor medium and a second region of semiconductor medium, comprising the steps of:

forming a photonic device on a substrate, including a first region in which the semiconductor medium has a first bandgap, and a second region in which the semiconductor medium has a second bandgap shifted from said first bandgap;

depositing a first contact in said first region for operating said photonic device;

depositing a second contact at least partially overlying said second region; and optically stimulating said second region to generate electroluminescence in the semiconductor medium;

electrically biassing said second contact so as to draw a photodetection current indicative of the magnitude of at least said second bandgap.

Throughout the present specification, the expression "active photonic device" is intended to encompass all optically active semiconductor devices deploying electrical charge injection techniques to generate photons or to modulate photons in an optically active region of the semiconductor. The invention is particularly suited for monolithic integration of multiple optical devices on a single chip for telecommunication applications. However, the invention can be applied to the monitoring of any active photonic device as defined above, including lasers, amplifiers and light emitting diodes.

The devices may be formed in any suitable semiconducting medium, particularly III-V and II-VI material systems.

DESCRIPTION OF THE DRAWINGS

Embodiments of the present invention will now be described by way of example and with reference to the accompanying drawings in which.

DETAILED DESCRIPTION

The present invention provides for monolithic integration of an active photonic device such as a semiconductor laser or optical amplifier and a photodetector device. The invention describes a simple monolithic solution to monitor, and hence enable control of, the output power of a semiconductor laser diode. The invention is particularly advantageous for large scale integration of multiple lasers or optical amplifiers on chip.

Figure 1:
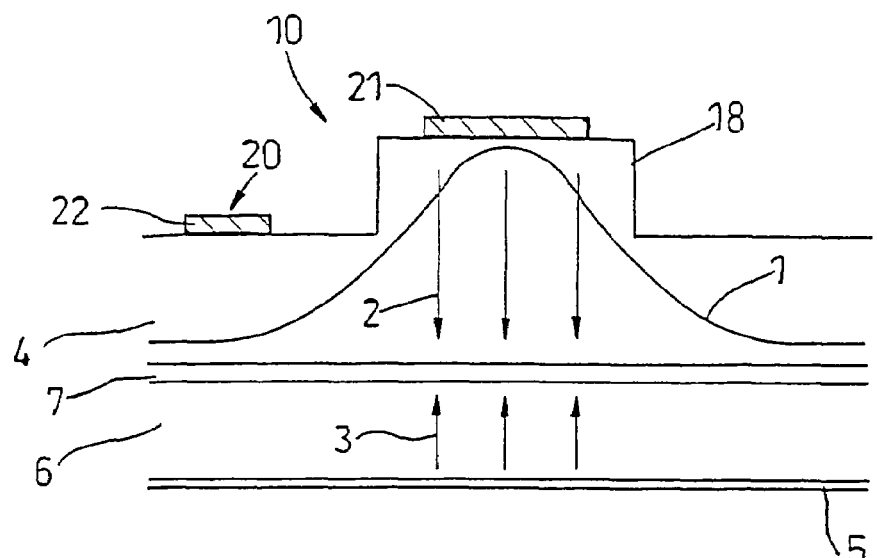
FIG. 1 shows a schematic transverse cross section of a laser device having a photodetector contact positioned laterally adjacent to an optical confinement structure of the laser device.
Figure 2A:
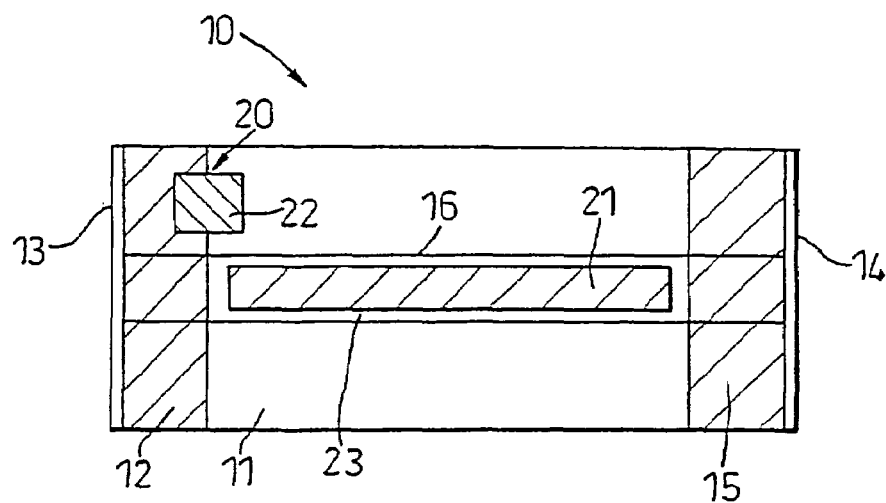
FIG. 2a shows a schematic top view of the laser device of FIG. 1, in which the photodetector contact partially overlies a bandgap shifted region.

With particular reference to FIGS. 1 and 2a, a semiconductor laser 10 comprises an optically active region 11, including a waveguide portion 16 extending therethrough. The optically active region 11 provides a semiconductor medium having a suitable band gap, in which carriers may be injected to create photons or modulate photon behaviour when operating in forward bias diode, using techniques well known in the art.

Optically passive regions 12, 15, having an increased band gap, are formed at each end of the waveguide portion 16, preferably using quantum well intermixing techniques, although any suitable method of locally increasing the bandgap is also acceptable.

The intermixed regions 12, 15 (or, more generally, the bandgap shifted regions) define non-absorbing mirrors (NAMs). On an optical output end of the laser 10, the NAM 12 is provided with an anti-reflective (AR) coating 13, and at the other end of the laser, the NAM 15 is provided with a high reflectivity (HR) coating 14. The use of intermixed facet ends to obtain the NAMs avoids catastrophic optical damage (COD) to the facets, allowing high power and long lifetime laser diodes to be fabricated.

A typical semiconductor laser diode is fabricated by etching the waveguide portion 16, using conventional processing techniques, as a ridge 18. The ridge is typically between 1 and 2 μm in height and width and of the order of 1000 μm in length. The ridge contains the major part of the optical field distribution 1 and substantially confines the electrical injection current 2 and 3. However, it will be understood that the principles of the invention can be applied in the context of any suitable optical confinement structure in a semiconductor medium, including buried heterostructures.

A p-type contact 21 is deposited on top of the ridge 18 to facilitate the current injection into the device 10. An n-type contact 5 is provided on the bottom of the device on or in the substrate. The body of the device is formed in conventional manner with an intrinsic optically active layer 7 generally confined by respective p- and n-type optically conducting layers 4 and 6. The p-type optically conducting layer 4 is typically of the order of 200 nm thick. Current is injected across the contacts 21 and 5; electrons and holes recombine in the optically active layer 7 to create photons. The ridge 18 constrains the optical mode of the device. The geometry of the p-type contact 21 and ridge effectively determine the lateral extent of a principal optical pathway 23 that passes through the device 10 between the facets at coatings 13 and 14.

The expression principal optical pathway is used to indicate the pathway through the semiconductor medium in which the substantial part of the optical field distribution 1 passes, and will be determined by, though not necessarily coextensive with, the optical confinement structure. This is due to the fact that significant leakage of the optical field 1 occurs out of the ridge waveguide 18 as shown in FIG. 1.

Preferably, the optical confinement structure, and thus the principal optical pathway 23, is substantially linear, as shown in the figures. Still more preferably, the optical confinement structure, and thus the principal optical pathway, is non-branching. The optical confinement structure may provide for a single optical mode of operation.

A further p-type contact 22 is deposited laterally separated from the ridge contact, to provide a photodetector contact. Preferably, to simplify the manufacturing process, this further p-type contact 22 is deposited at the same time as the laser p-type ridge contact 21.

In a preferred embodiment, the photodetector comprises a photodiode, and this photodiode contact 22 is located sufficiently close to the ridge contact 21 that there is overlap with the optical field generated by the active region of the laser. However, the photodiode contact is located sufficiently far from the ridge contact to limit current spreading of the injection current 2 (see FIG. 1). Thus, the photodetector contact is positioned such that it at least partially overlies a small part of the principal optical pathway through the device, but is laterally separated from the optical confinement structure, eg. ridge 18.

The relative position of the contacts 21 and 22 is such as to ensure that the optically active device and the photodetector: (a) are sufficiently far apart that there is no serious electrical cross-talk between devices; (b) are sufficiently close together that there is enough light to generate a photocurrent and hence signal in the photodiode; and (c) do not seriously interfere to compromise the performance of the optically active device, for example by way of optical feedback into a laser. In the preferred configuration of FIG. 2a, the lateral separation distance of the contacts 21 and 22 is of the order of 10 μm.

The photodiode is preferably also positioned at least partly over the passive (bandgap shifted) region 12 and the active region 11, and close to the laser output facet 13 as best seen in FIG. 2a. Although the photodiode contact 20 is shown in FIG. 2a at the optical output end of the laser (ie. adjacent to the AR coating 13 of the NAM 12), the photo-detector 20 can also be located adjacent to the HR coating 14 of the NAM 15, as shown in FIG. 2d.

Figure 2B:
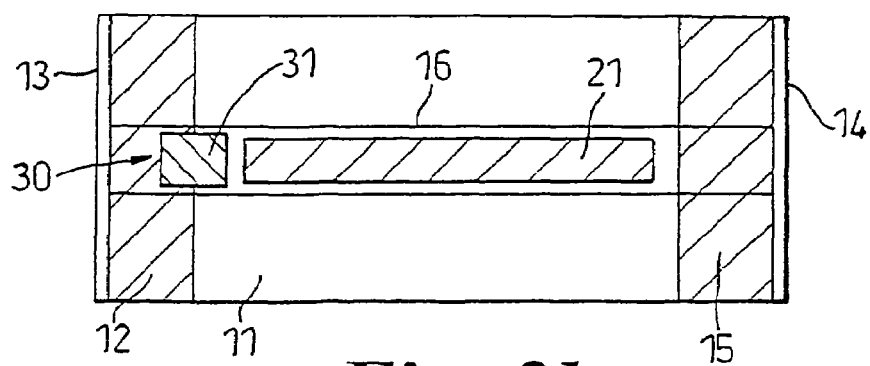
FIG. 2b shows a schematic top view of a laser device in which the photodetector contact is positioned within the optical confinement structure and partially overlying the bandgap shifted region.
Figure 2C:
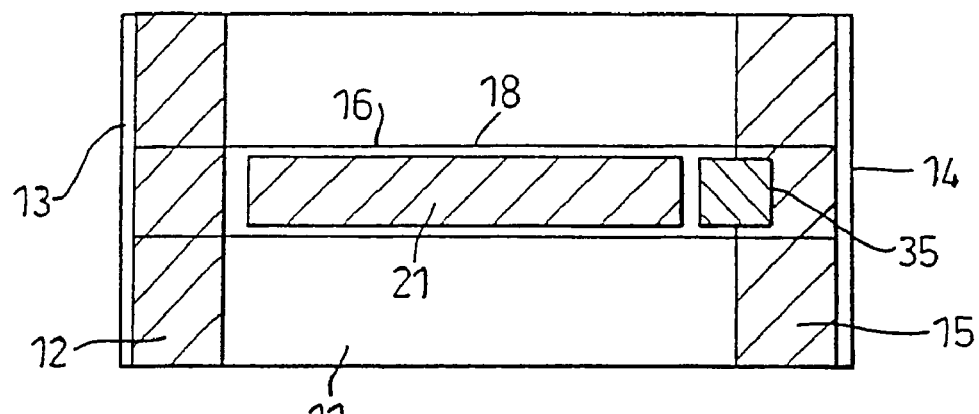
FIG. 2c shows a schematic top view of the laser device similar to FIG. 2b, but with the photodetector contact positioned at the highly reflective coating end of the device.

With reference to FIG. 2b, an alternative configuration of photodetector 30 is shown. In this embodiment, the contact 31 for the photodiode 30 is located directly on top of the ridge 18 in longitudinal alignment with, but spaced from, the ridge contact 21. Although the photodiode contact 31 is shown in FIG. 2b at the optical output end of the laser (ie. adjacent to the AR coating 13 of the NAM 12), the photo-detector contact 35 can also be located adjacent to the HR coating 14 of the NAM 15, as shown in FIG. 2c.

It will be understood that the photodetector can be provided in similar manner in an optical amplifier in which both ends of the device 10 are provided with an AR coating.

Figure 2D:
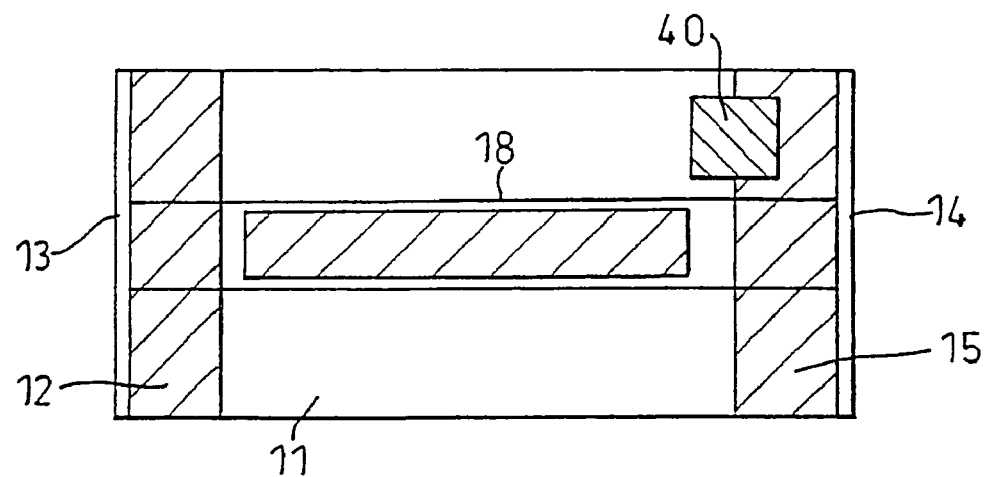
FIG. 2d shows a schematic top view of the laser device similar to FIG. 2a, but with the photodetector contact positioned at the highly reflective coating end of the device.
Figure 2E:
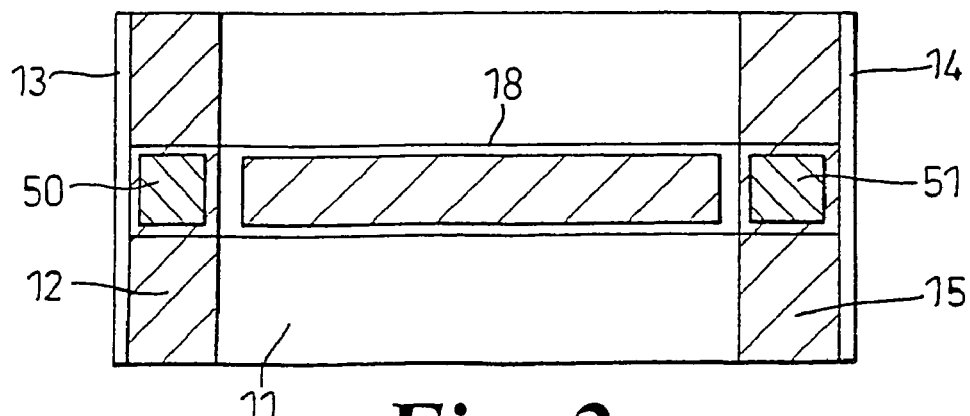
FIG. 2e shows a schematic top view of the laser device similar to FIG. 2b, but with the photodetector contacts positioned entirely within the bandgap shifted regions.

In the embodiments of FIGS. 2a and 2d, the photodetector contact 22, 40 is shown laterally offset from the ridge 18. As best viewed in FIG. 1, the contact is positioned to overlap the 'tail' of the optical field distribution, but sufficiently far away from the current injection 2 into the active region to avoid significant interference therewith, as previously described.

The photo detectors 20, 30, 35, 40 are weakly coupled to the active regions 16 of the lasers such that a very small proportion of the optical radiation from the laser active region can be monitored without deleteriously affecting the performance of the laser. In a typical example, the ridge contact 21 will supply an injection current in the region of several hundreds of microamps whereas the photodetector contact 22 will only need to draw a detection current in the region of picoamps to nanoamps, ie. a current approximately of the order of $10^4$-$10^8$ times smaller.

In photodiode mode, the photodiode contact 20 is driven in reverse bias mode such that photons from the 'tail' of the optical field 1 can generate carriers in the band and hence create a photocurrent which can be measured. The relative power that is 'tapped' out, which determines the responsivity of the detector, can easily be controlled by the distance between the photodiode and ridge.

The advantage of measuring the photocurrent by this method is that there is effectively no loss to 'tap-off' optical power and there is no optical coupling mechanism between the laser 10 and the detector 20 that can create an additional cavity effect that could have a deleterious effect on the optical performance of the laser.

Because it is no longer necessary to place a photodetection device behind the HR coated facet 14 of the device, the reflectivity of this facet may be increased from the conventional figure of R~95% to a maximum value of R>99.9%. An increase in output power of the device of ~5% is therefore possible.

In the embodiments of FIGS. 2a and 2d, the photodiode contact 22, 40 has been placed off-set to the side of the ridge, towards the AR coating of the device, or towards the HR coating 14 of the device. In FIGS. 2b, 2c, 2e and 2f, the photodetector contact 31, 35, 50, 51, 60, 61 is placed on the optical confinement structure (eg. ridge 18) but longitudinally separated from the ridge contact to a sufficient distance to ensure adequate electrical isolation therefrom. The operation of the photodetector in reverse bias mode is similar to that previously described in connection with FIGS. 2a and 2d, although the photodetector of course is positioned at or close to the peak of the optical field distribution 1 in the principal optical path.

In the examples of FIGS. 2a to 2d, the photodetector contact is positioned straddling the bandgap shifted region 12 and the non-shifted region 11. This enables the photo-detector contact 22, 31, 35 to be used to inject carriers (using a forward bias mode of operation) into the bandgap shifted/non-shifted regions of the device to monitor the effectiveness of the intermixing process used to create the bandgap shift.

By driving the photodetector contact in forward bias mode, photons will be generated at first and second wavelengths corresponding respectively to the bandgap shifted and non-shifted regions 12 and 11. If the laser device 10 is not operational, it is then possible to use an external photodetection device to observe the electro-luminescence (EL) signal generated, which can be received via the facet at AR coating 13. The relative separation of the two wavelengths of the EL signal provides a measure of the degree of bandgap shifting between the two regions 11 and 12. In the case of contact 40 (FIG. 2d), an EL signal generated may be received via the facet at HR coating 14 if this allows sufficient optical transmission for detection purposes. Of course, in an optical amplifier, this facet would have an AR coating.

This EL signature can provide an in-situ characterisation technique to measure the size of the intermixed regions during the manufacturing process.

Figure 2F:
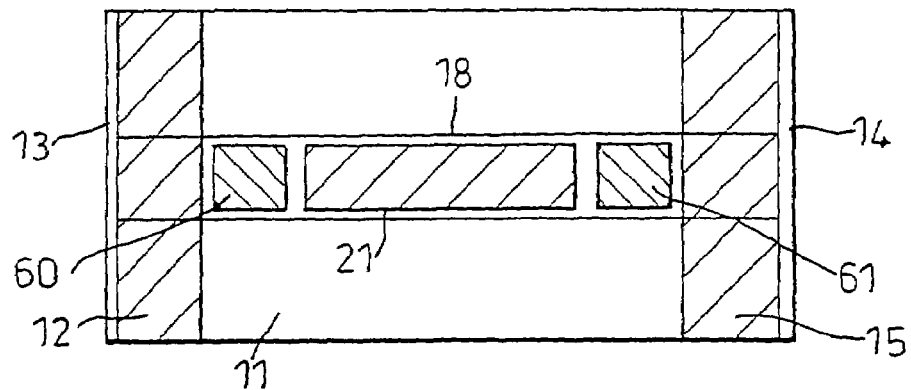
FIG. 2f shows a schematic top view of the laser device similar to FIG. 2e, but with the photodetector contacts positioned entirely outside the bandgap shifted regions.
Figure 3A:
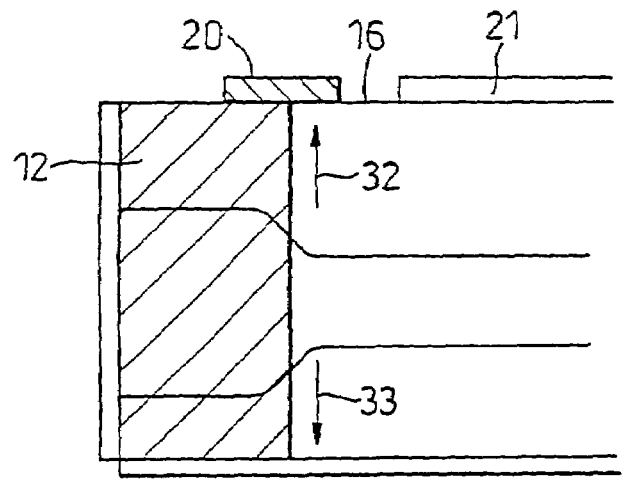
FIG. 3a shows a schematic diagram of the band gap at the facet end of the device of FIG. 1.

FIG. 3a shows a schematic of the band-gap of the facet ends of the device of FIGS. 2a to 2f. The photodiode contact 22, 31, 36 or 40 is located overlapping the bandgap shifted (intermixed) region 12 or 15 and the non-shifted region 11 of the device 10 in a passive section of the device spaced apart from the active region contact 21. Photons generated in the optically active region 11 of the device cause corresponding electron and hole currents 32, 33 that can be measured by the photodetector 20, 30.

Figure 3B:
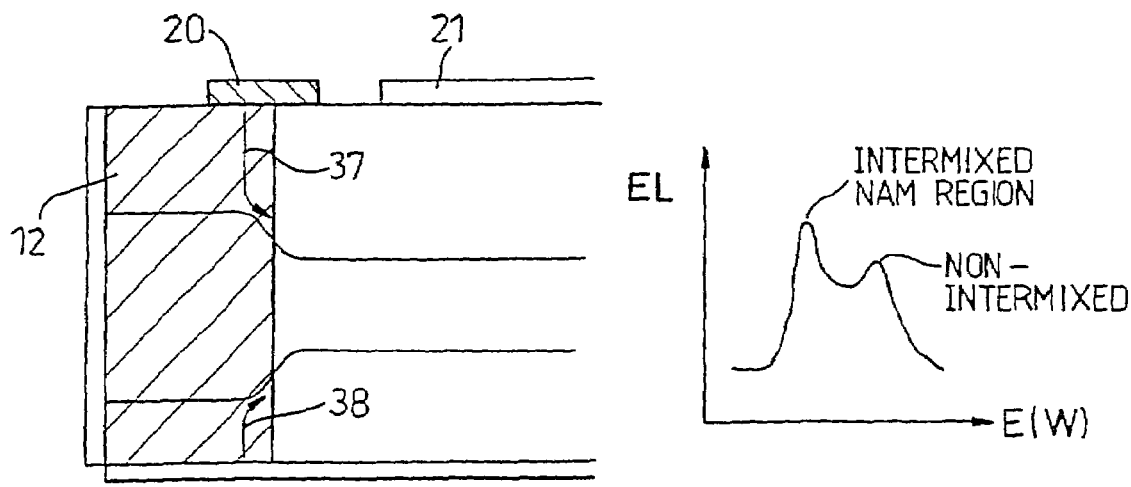
FIG. 3b shows a schematic diagram of the band gap at the facet end of the device of FIG. 1, with the photodetector operating in forward bias mode.

Alternatively, in FIG. 3b, the photodiode contact 22, 31 or 36 is shown driven in forward bias mode to create carrier current 37, 38 to generate electroluminescence in the bandgap shifted/non-shifted regions of the device.

In the described forward bias mode of operation of the photodiode, an electrical current is injected to generate an electroluminescence signal. In a further mode of operation, an external optical source can be used to stimulate emission of photons of different wavelengths from the bandgap shifted/non-shifted regions. The photodetector contact can then be operated in reverse bias mode, again to detect photocurrents corresponding to each of the bandgap shifted and non-shifted regions in order to determine a degree of quantum well intermixing during the fabrication process.

In will be understood that this optical stimulation and reverse bias photodetection mode of operation can be effected on an uncleaved wafer and therefore provide for characterisation of the QWI manufacturing process for each laser device fabricated on the wafer.

With further reference to FIG. 2f, the photodetector contact 60, 61 has been placed wholly within the optically active region 11, on the ridge either at the AR coating end, or the HR coating end, or both. In this arrangement, for use in the reverse bias photodiode mode, the photodetector contact must be positioned sufficiently far from the ridge contact to achieve adequate electrical isolation. Those skilled in the field will appreciate that electrical isolation may be particularly effected by inclusion of an electrical isolation structure in the semiconductor medium between the two contacts 21 and 60 or 21 and 61. By contrast, in the embodiment of FIG. 2e, adequate electrical isolation is assured by the bandgap shifted region in which the photodetector contact 50 or 51 resides.

In all of the described embodiments, the p-type metallisation of the ridge contact 18 and adjacent photodetector contact 22, 31, 36, 40, 50, 60 etc can be deposited simultaneously to improve the manufacturability of the device.

It will be understood that the exact configuration and location of the active photonic device with respect to the photodiode is dependent on the particular application. For example, a higher power laser diode would require a photodiode with the same level of detectivity as for a low power laser and thus can be positioned further away from the laser. The responsivity of the detector can be of the order of 0.1 mA/mW or less. The responsivity of the detector can be changed by varying the distance from the optical source. If the distance between the active photonic device and photodetector is short such that electrical cross-talk could occur, then electrical isolation can be obtained by using conventional isolation techniques, such as a shallow etch and/or ion implantation.

Aspects of the invention provide the following advantages over the prior art devices.

1) the diode contact is deposited adjacent to (and preferably at the same time as) the p-type ridge contact 18. Thus, there need be no additional processing steps than used in making a laser or amplifier.
2) The photodetector 20 can be fully integrated with multiple laser devices on the same chip.
3) There is no need to fabricate a complex Y-junction waveguide.
4) Since manufacture of the device is by 'on-chip' processing, the reliability of the device will be improved over those that require attachment of discrete diode components.
5) The packaging process is simplified, thereby reducing manufacturing cost.
6) The device can operate as a photodiode to monitor the optical power on the back facet and/or the front facet.
7) The device can monitor the effectiveness of the NAM by operating in reverse bias. The EL emission measurement can determine the band-gap shift.
8) The back reflector can have a reflectivity value of up to 99.9%. Therefore the forward output power can be increased by approximately 5% over devices which position a photodetector behind the back facet.
9) The photodetector does not significantly influence the performance of the active photonic device.

Although the preferred implementation of the photodetector described above is in conjunction with an active device having an optical confinement structure for operating in a single optical mode of operation, the principles can also be applied to multimode devices, optical amplifiers and light emitting diodes.

Other embodiments are intentionally within the scope of the accompanying claims.

The invention claimed is:

1. An active photonic device, comprising:
   a semiconductor substrate;
   an optically active region formed on the semiconductor substrate, the optically active region comprising a first electrical contact for initiating emission of photons and/or modulation of photons within the optically active region;
   an optical confinement structure defining a principal optical path through the active photonic device and through the optically active region;
   a photodetector formed on the semiconductor substrate, the photodetector comprising a second electrical contact that is separated laterally from the optical confinement structure, the second contact being displaced from, and substantially electrically insulated from, the first electrical contact and overlying at least part of the principal optical path, the photodetector for receiving carriers generated by emitted photons; and at least one bandgap shifted region in the principal optical path, the at least one bandgap shifted region having a larger bandgap than the optically active region, wherein the second electrical contact is positioned at least partly over the bandgap shifted region.

2. The active photonic device of claim 1, wherein the optical confinement structure is substantially linear.

3. The active photonic device of claim 1, wherein the optical confinement structure is non-branching.

4. The active photonic device of claim 1, wherein the optical confinement structure has a single optical mode.

5. The active photonic device of claim 1, comprising a bandgap shifted region at each end of the principal optical path.

6. The active photonic device of claim 1, wherein the optical confinement structure comprises a ridge waveguide.

7. The active photonic device of claim 1, wherein the bandgap shifted region is formed using at least one intermixing technique.

8. The active photonic device of claim 1, wherein the active photonic device comprises a laser, and the optical confinement structure comprises a mirror at one end thereof having a reflection coefficient of substantially higher than 95%.

9. The active photonic device of claim 8, wherein the mirror has a reflection coefficient of greater than or equal to 99.9%.

10. The active photonic device of claim 1, further comprising an electrical isolation structure between the first and second electrical contacts.

11. An active photonic device, comprising:
a semiconductor substrate;
an optically active region formed on the semiconductor substrate, the optically active region comprising a first electrical contact;
a non-branching optical confinement structure defining an optical path through the active photonic device and through the optically active region;
a photodetector structure formed on the semiconductor substrate, the photodetector structure comprising a second electrical contact that is separated laterally from the non-branching optical confinement structure, the second electrical contact being displaced from, and electrically insulated from, the first electrical contact, the photodetector structure for receiving carriers generated by photons in the optically active region; and
at least one bandgap shifted region in the optical path, the at least one bandgap shifted region having a larger band gap than the optically active region, wherein the second electrical contact is positioned at least partly over the bandgap shifted region.

12. An active photonic device, comprising:
a semiconductor substrate comprising an optical confinement structure that defines a principal optical pathway;
an optically active region formed on the semiconductor substrate and comprising a semiconductor medium having a first bandgap, the optically active region comprising a first electrical contact disposed over the optical confinement structure, the first electrical contact for initiating emission of photons and/or modulation of photons within the optically active region;

a bandgap shifted region formed on the semiconductor substrate, the bandgap shifted region comprising a semiconductor medium having a second bandgap shifted from the first bandgap; and a characterization contact formed on the semiconductor substrate and separated laterally from the optical confinement structure, the characterization contact being displaced from, and substantially electrically insulated from, the first electrical contact, at least a part of the characterization contact overlying the bandgap shifted region, the characterisation contact for enabling detection of a bandgap shift in the active photonic device.

13. The active photonic device of claim 12, wherein the characterization contact entirely overlies the bandgap shifted region.

14. The active photonic device of claim 12, wherein the characterization contact is adjacent to an output facet of the active photonic device.

15. A method comprising:
determining a degree of bandgap shift between a first region of semiconductor medium and a second region of semiconductor medium, wherein determining the degree of bandgap shift comprises:
forming a photonic device on a substrate, the photonic device comprising the first region in which the semiconductor medium has a first bandgap and the second region in which the semiconductor medium has a second bandgap shifted from said first bandgap;
depositing a first contact in the first region for operating the photonic device;
depositing a second contact at least partially overlying the second region; and
electrically biasing the second contact to generate an electroluminescence signal in the semiconductor medium, the electroluminescence signal being indicative of a magnitude of at least the second bandgap.

16. The method of claim 15, wherein the second contact is deposited overlying portions of both the first region and the second region, and wherein the electroluminescence signal is indicative of a difference in magnitude between the first and second bandgaps.

17. The method of claim 15, wherein the first region contains an optical confinement structure that contains a principal optical pathway; and
wherein the second contact is separated laterally from the optical confinement structure, the second contact being displaced from, and substantially electrically insulated from, the first contact.

18. A method comprising:
determining a degree of bandgap shift between a first region of semiconductor medium and a second region of semiconductor medium, wherein determining the degree of bandgap shift comprises;
forming a photonic device on a substrate, the photonic device comprising the first region in which the semiconductor medium has a first bandgap and the second region in which the semiconductor medium has a second bandgap shifted from said first bandgap;
depositing a first contact in the first region for operating the photonic device;

depositing a second contact at least partially overlying the second region;

optically stimulating the second region to generate electroluminescence in the semiconductor medium; and electrically biasing the second contact so as to draw a photodetection current indicative of a magnitude of at least the second bandgap.

19. The method of claim 18, wherein the second contact is deposited overlying portions of both the first region and the second region, and wherein the photodetection current generated is indicative of a difference in magnitude between the first and second bandgaps.

20. The method of claim 18, wherein the first region contains an optical confinement structure that contains a principal optical pathway; and wherein the second contact is separated laterally from the optical confinement structure, the second contact being displaced from, and substantially electrically insulated from, the first contact.

* * * * *